(12) United States Patent
Sung et al.

(10) Patent No.: US 11,229,119 B2
(45) Date of Patent: *Jan. 18, 2022

(54) PRINTED CIRCUIT BOARD

(71) Applicant: SAMSUNG ELECTRO-MECHANICS CO., LTD., Suwon-si (KR)

(72) Inventors: Ki Jung Sung, Suwon-si (KR); Tae Seong Kim, Suwon-si (KR); Jae Woong Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 5 days.

This patent is subject to a terminal disclaimer.

(21) Appl. No.: 16/728,364

(22) Filed: Dec. 27, 2019

(65) Prior Publication Data

US 2021/0100104 A1 Apr. 1, 2021

(30) Foreign Application Priority Data

Sep. 30, 2019 (KR) .......................... 10-2019-0121006

(51) Int. Cl.
| | |
|---|---|
| *H05K 1/16* | (2006.01) |
| *H01F 27/28* | (2006.01) |
| *H05K 1/11* | (2006.01) |
| *H05K 1/18* | (2006.01) |

(Continued)

(52) U.S. Cl.
CPC ......... *H05K 1/165* (2013.01); *H01F 27/2804* (2013.01); *H05K 1/115* (2013.01); *H05K 1/185* (2013.01); *H01F 2027/2809* (2013.01); *H01L 23/49816* (2013.01); *H01L 23/49822* (2013.01); *H01L 23/49838* (2013.01); *H01L 24/16* (2013.01); *H01L 2224/16227* (2013.01); *H01L 2224/16237* (2013.01); *H05K 1/181* (2013.01);

(Continued)

(58) Field of Classification Search
CPC ...................................................... H05K 1/165
USPC ....................................................... 361/763
See application file for complete search history.

(56) References Cited

U.S. PATENT DOCUMENTS

| | | | |
|---|---|---|---|
| 9,265,158 B2* | 2/2016 | Mano | H05K 3/4602 |
| 9,357,660 B2* | 5/2016 | Yoshikawa | H01L 23/5389 |
| 10,290,414 B2* | 5/2019 | Yun | H05K 1/165 |

(Continued)

FOREIGN PATENT DOCUMENTS

KR 10-2016-0114792 A 10/2016

*Primary Examiner* — Stanley Tso

(74) *Attorney, Agent, or Firm* — Morgan, Lewis & Bockius LLP

(57) ABSTRACT

A printed circuit board includes a core layer having a first through-portion, a coil structure disposed in the first through-portion and comprising a support member, a first coil pattern in a planar spiral form disposed on one surface of the support member, and a body comprising a magnetic substance, wherein the support member and the first coil pattern are accommodated in the body, a first build-up layer covering at least a portion the core layer and disposed in at least a portion of the first through-portion, a first wiring layer disposed on one surface of the first build-up layer, and a first via layer passing through at least a portion of the first build-up layer and connected to the first wiring layer. The first via layer comprises a first wiring via connecting at least a portion of the first wiring layer to the first coil pattern.

15 Claims, 10 Drawing Sheets

(51) Int. Cl.
*H01L 23/498* (2006.01)
*H01L 23/00* (2006.01)

(52) U.S. Cl.
CPC .............. *H05K 2201/10015* (2013.01); *H05K 2201/10734* (2013.01)

(56) References Cited

U.S. PATENT DOCUMENTS

| | | | | |
|---|---|---|---|---|
| 10,842,021 | B1* | 11/2020 | Song | H01L 23/645 |
| 2014/0118976 | A1* | 5/2014 | Yoshikawa | H01L 23/49827 |
| | | | | 361/763 |
| 2015/0170823 | A1* | 6/2015 | Jeong | C25D 5/022 |
| | | | | 336/200 |
| 2015/0382471 | A1* | 12/2015 | Furutani | H05K 1/116 |
| | | | | 361/763 |
| 2016/0219713 | A1* | 7/2016 | Kim | H05K 1/0207 |
| 2016/0284462 | A1* | 9/2016 | Ahn | H01F 27/06 |
| 2016/0309575 | A1* | 10/2016 | Min | H05K 1/0204 |
| 2016/0338202 | A1* | 11/2016 | Park | H01L 24/00 |
| 2017/0103845 | A1* | 4/2017 | Nagai | H01F 3/14 |
| 2020/0350303 | A1* | 11/2020 | Nart | H01L 21/47 |

* cited by examiner

PRINTED CIRCUIT BOARD

CROSS-REFERENCE TO RELATED APPLICATION(S)

This application claims benefit of priority to Korean Patent Application No. 10-2019-0121006 filed on Sep. 30, 2019, in the Korean Intellectual Property Office, the disclosure of which is incorporated herein by reference in its entirety.

TECHNICAL FIELD

The present disclosure relates to a printed circuit board.

BACKGROUND

Central processing units (CPUs), application specific integrated circuits (ASICs), application processors (APs), and the like, receive power from power management integrated circuits (PMICs). Recently, a power supply switching frequency of the PMIC has been increasing to improve power efficiency. In this regard, there is demand for a package substrate in the form of a multilayer printed circuit board having a function of an inductor.

SUMMARY

An aspect of the present disclosure is to provide a printed circuit board having high magnetic permeability even at a high frequency and having a function of an inductor.

Another aspect of the present disclosure is to provide a printed circuit board, which can be slimmed and miniaturized through a reduction in thickness.

Another aspect of the present disclosure is to provide a printed circuit board having a function of a capacitor in addition to the function of an inductor.

According to an aspect of the present disclosure, an electrical connection path is provided between a coil pattern of an inductor and a wiring layer in a printed circuit board through a wiring via without external electrodes while accommodating a thin film inductor in the printed circuit board. Additionally, a chip-type capacitor is further accommodated together with the inductor, if necessary.

For example, a printed circuit board according to an embodiment of the present disclosure may include a core layer having a first through-portion, a coil structure disposed in the first through-portion and including a support member, a first coil pattern in a planar spiral form disposed on one surface of the support member, and a body including a magnetic substance, wherein the support member and the first coil pattern are accommodated in the body, a first build-up layer covering at least a portion the core layer and disposed in at least a portion of the first through-portion so that the coil structure is accommodated therein, a first wiring layer disposed on one surface of the first build-up layer, and a first via layer passing through at least a portion of the first build-up layer and connected to the first wiring layer. The first via layer may include a first wiring via connecting at least a portion of the first wiring layer to the first coil pattern.

For example, a printed circuit board according to an embodiment of the present disclosure may include a plurality of insulating layers, a plurality of wiring layers, and a plurality of via layers, and a coil structure embedded in the plurality of insulating layers. The coil structure comprises a support member, a coil pattern in a planar spiral form disposed on at least one surface of the support member, and a body comprising a magnetic substance, the support member and the coil pattern are embedded in the body. At least one of the plurality of via layers electrically connects at least one of the plurality of wiring layer to the coil pattern.

If necessary, a printed circuit board according to an embodiment may further include a capacitor disposed in parallel to the coil structure in the first through-portion and accommodated in the first build-up layer. The first via layer may further include a third wiring via connecting the capacitor to at least the other portion of the first wiring layer. Alternately, the core layer may further include a second through-portion spaced apart from the first through-portion. The printed circuit board may further include a capacitor disposed in parallel to the coil structure in the second through-portion and accommodated in the first build-up layer. The first via layer may further include a third wiring via connecting the capacitor to at least the other portion of the first wiring layer.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
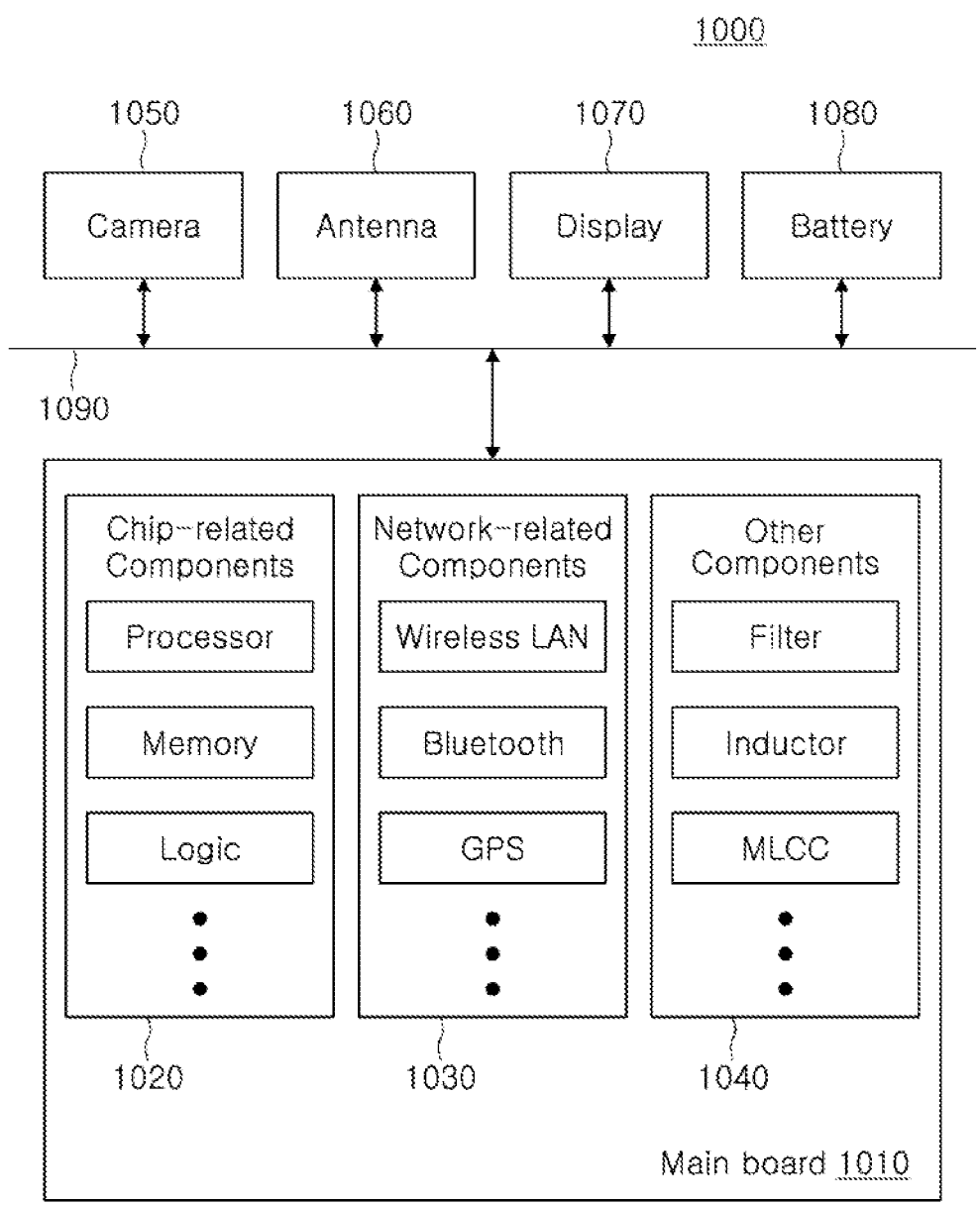
FIG. 1 is a block diagram illustrating an example of an electronic device system.

Hereinafter, the present disclosure will be described with reference to the accompanying drawings. In the drawings, shapes, sizes, and the like, of components may be exaggerated or omitted for clarity.

Electronic Device

FIG. 1 is a block diagram illustrating an example of an electronic device system.

Based on FIG. 1, the electronic device 1000 accommodates a main board 1010 therein. The main board 1010 includes chip-related components 1020, network-related components 1030, miscellaneous other components 1040, and the like, physically and/or electrically connected thereto. Said components are connected to other electronic components described below, thereby creating various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, but is not limited thereto. Other types of chip-related components may be included. In addition, these chip-related components 1020 may be combined with each other. The chip-related components 1020 may be in the form of a package containing the previously described chip-related components and/or electronic components.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G and 5G protocols, and any other wireless and wired protocols designated after the abovementioned protocols, but is not limited thereto. The network-related components 1030 may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like, but are not limited thereto. The other components 1040 may also include passive components, or the like, used for various other purposes. In addition, the other components 1040 may be combined with each other, together with the chip-related components 1020 or the network-related components 1030 described above.

The electronic device 1000 may include other components, which may or may not be physically and/or electrically connected to the main board 1010, depending on a type of the electronic device 1000. These other components may include, for example, a camera module 1050, an antenna module 1060, a display device 1070, a battery 1080, but are not limited thereto. The other components may also include an audio codec, a video codec, a power amplifier, a compass, an accelerometer, a gyroscope, a speaker, a mass storage unit (for example, a hard disk drive), a compact disk (CD), a digital versatile disk, or the like. These other components may also include other components, or the like, used for various purposes depending on a type of electronic device1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited thereto. The electronic device 1000 may be any other electronic device processing data.

Figure 2:
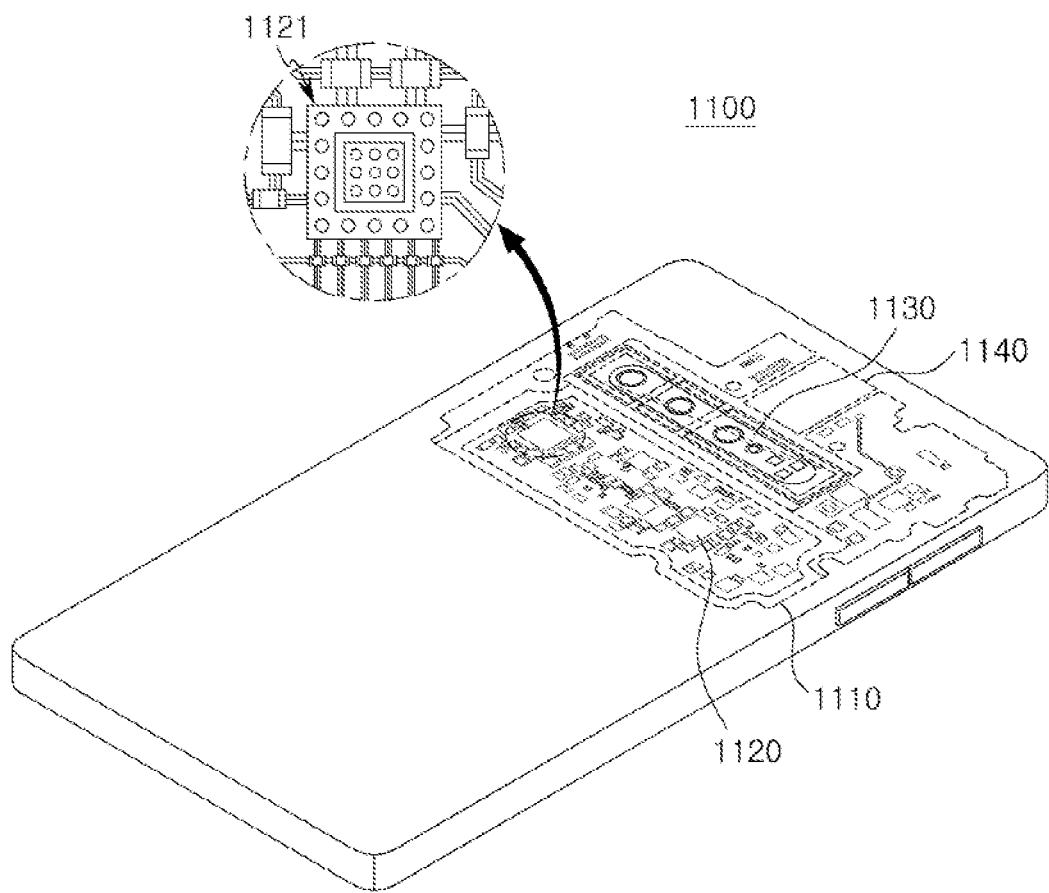
FIG. 2 is a perspective view schematically illustrating an example of an electronic device.

FIG. 2 is a perspective view schematically illustrating an example of an electronic device.

Based on FIG. 2, an electronic device may be a smartphone 1100. A mainboard 1110, to which various electronic components 1120 are physically and/or electrically connected, is accommodated in the smartphone 1100. Additionally, other components, which may or may not be physically and/or electrically connected to the main board 1110, such as a camera module 1130 and/or a speaker 1140, may be accommodated in the smartphone 1100.

Some of the electronic components 1120 may be the previously described chip-related components; for example, a semiconductor package 1121, but is not limited thereto. The semiconductor package 1121 may be in the form in which a semiconductive chip or a passive component is surface-mounted, but is not limited thereto. Meanwhile, the electronic device is not necessarily limited to the smartphone 1100 and may be other electronic devices as described above.

Printed Circuit Board

Figure 3:
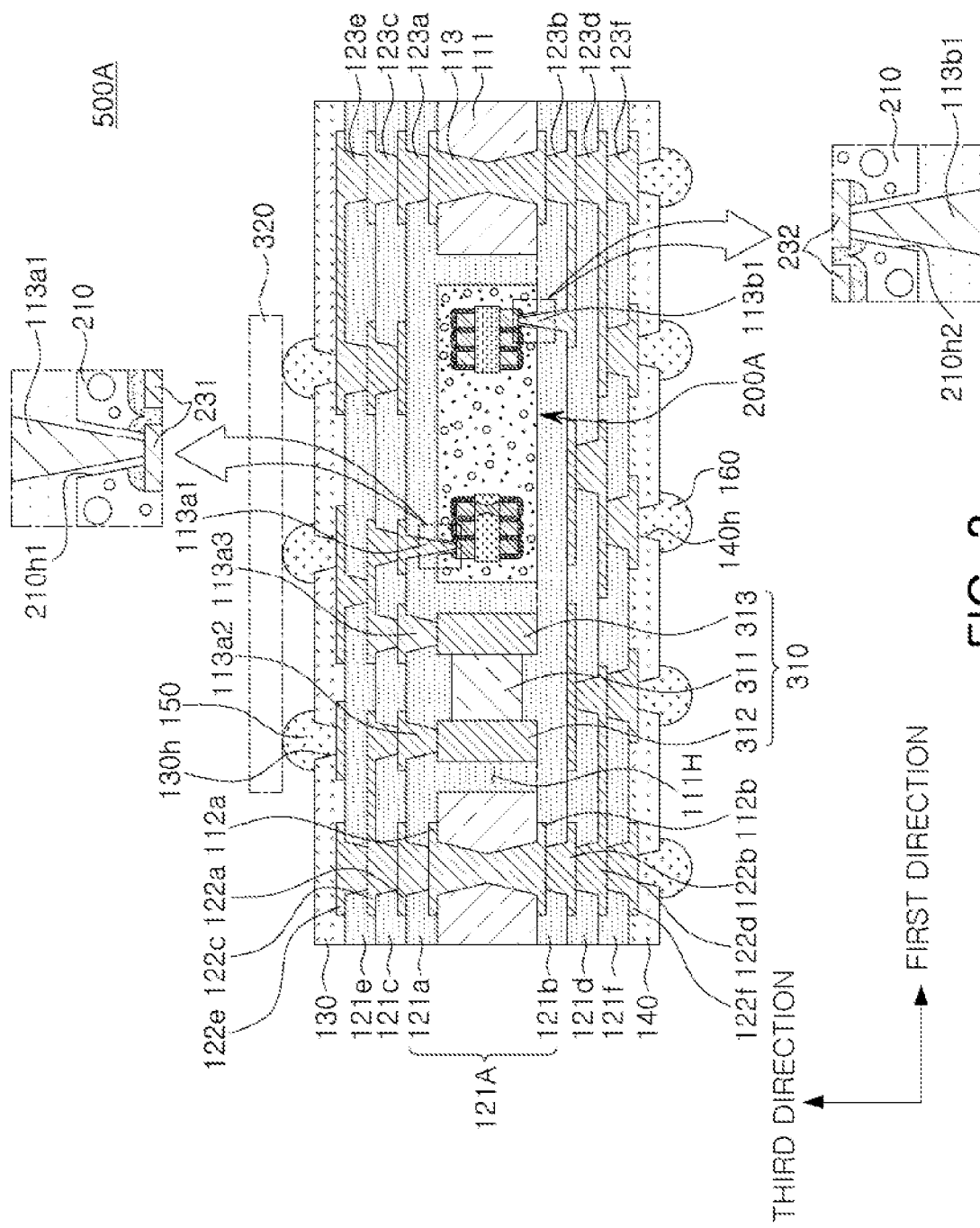
FIG. 3 is a cross-sectional view schematically illustrating an example of a printed circuit board.

FIG. 3 is a cross-sectional view schematically illustrating an example of a printed circuit board.

Based on FIG. 3, a printed circuit board 500A according to an embodiment has a multilayer printed circuit board shape, in which a plurality of insulating layers 111 and 121a to 121f and a plurality of via layers 113 and 123a to 123f are included. A coil structure 200A is accommodated in the plurality of insulating layers 111 and 121a to 121f.

For example, a printed circuit board 500A according to an embodiment may include a core layer 111, first and second core wiring layers 112a and 112b respectively disposed on upper and lower surfaces of the core layer 1111, a core via layer 113 passing through at least a portion of the core layer 111 and electrically connecting the first and second core wiring layers 112a and 112b, a first build-up layer 121A covering both surfaces of the core layer 111, a first wiring layer 122a disposed on an upper surface of an upper insulating layer 121a of the first build-up layer 121A, a second wiring layer 122b disposed on a lower surface of a lower insulating layer 121b of the first build-up layer 121A, a first via layer 123a passing through at least a portion of the upper insulating layer 121a of the first build-up layer 121A and electrically connecting the first core wiring layer 112a and the first wiring layer 122a, a second via layer 123b passing through at least a portion of the lower insulating layer 121b of the first build-up layer 121A and electrically connecting the second core wiring layer 112b and the second wiring layer 122b.

If necessary, the printed circuit board 500A according to an embodiment may further include a second build-up layer 121c disposed on the upper surface of the upper insulating layer 121a of the first build-up layer 121A, a third wiring layer 122c disposed on an upper surface of the second build-up layer 121c, a third via layer 123c passing through at least a portion of the second build-up layer 121c and electrically connecting the first and third wiring layers 122a and 122c, a third build-up layer 121d disposed on the lower surface of the lower insulating layer 121b of the first build-up layer 121A, a fourth wiring layer 122d disposed on a lower surface of the third build-up layer 121d, and a fourth via layer 123d passing through at least a portion of the third build-up layer 121d and electrically connecting the second and fourth wiring layers 122b and 122d.

If necessary, the printed circuit board 500A according to an embodiment may further include a fourth build-up layer 121e disposed on an upper surface of the second build-up layer 121c, a fifth wiring layer 122e disposed on an upper surface of the fourth build-up layer 121e, a fifth via layer 123e passing through at least a portion of the fourth build-up layer 121e and electrically connecting the third and fifth wiring layers 122c and 122e, a fifth build-up layer 121f disposed on the lower surface of the third build-up layer 121d, a sixth wiring layer 122f disposed on a lower surface of the fifth build-up layer 121f and a sixth via layer 123f passing through at least a portion of the fifth build-up layer 121f and electrically connecting the fourth and sixth wiring layers 122d and 122f.

If necessary, a printed circuit board 500A according to an embodiment may further include a first passivation layer 130 disposed on an upper surface of the fourth build-up layer 121e and including a plurality of first openings 130h exposing at least a portion of the fifth wiring layer 122e, a second passivation layer 140 disposed on the lower surface of the fifth build-up layer 121f and including a plurality of second openings 140h exposing at least a portion of the sixth wiring layer 122f, a plurality of first electrical connection metals 150 independently disposed on the plurality of first openings 130h and electrically connected to the exposed fifth wiring layer 122e and a plurality of second electrical connection metal 160 independently disposed on the plurality of second openings 140h and electrically connected to the exposed sixth wiring layer 122f.

As previously described, CPUs, ASICs, APs, and the like, have recently been receiving power from PMICs. In this regard, power supply switching frequency of PMICs has been increasing to improve power efficiency. Accordingly, it can be considered to arrange an inductor on a mainboard, separately from a package substrate on which an integrated circuit (IC) is surface-mounted. In this case, however, not only a high capacity inductor is required, but also an electrical path between the inductor and the IC mounted on the package substrate elongates, thereby increasing resistance and lowering power efficiency. Alternatively, it can be considered to form a coil with a pattern inside the package board. In this case, however, it may be difficult to achieve capacity as the coil is formed in the air, rather than in a magnetic body. Further, a considerably large surface area of the package substrate needs to be employed to form a pattern coil, which may increase an overall size of the package substrate. It can also be considered to mount a die-shaped inductor on a bottom surface of the package board, but a price thereof may be high.

In contrast, a printed circuit board 500A according to an embodiment includes a core layer 111 and a through-portion 111H, and a coil structure 200A is disposed in the through-portion 111H. The coil structure 200A is embedded in a first build-up layer 121A filling at least a portion of the through-portion 111H. The coil structure 200A may have a thin-film type inductor structure having no separate external electrodes. First and second coil patterns 231 and 232 of the coil structure 200A are electrically connected to at least portions of the first wiring layer 122a and the second wiring layer 122b, respectively, through the first and second wiring vias 113a1 and 113b1 of the first and second via layers 113a and 113b, respectively. For example, a coil structure 200A according to an embodiment includes a body 210 embedding first and second coil patterns 231 and 232 and including a magnetic substance. The body 210 includes first and second openings 210h1 and 210h2 partially opening the first and second coil patterns, respectively. The first build-up layer 121A fills at least a portion of the first and second openings 210h1 and 210h2. The first and second wiring vias 113a1 and 113b1 pass through at least a portion of the first build-up layer 121A and are connected to the first and second coil patterns 231 and 232, respectively, on the first and second openings 210h1 and 210h2. At least a portion of a side surface of each of the first and second wiring vias 113a1 and 113b1 in the first and second openings 210h1 and 210h2 is covered by the first build-up layer 121A. For example, a side surface of each of the first and second wiring vias 113a1 and 113b1 may be surrounded by an insulating substance of the first build-up layer 121A to be electrically isolated.

As such, as the printed circuit board 500A according to an embodiment includes the body 210 in which the coil structure 200A according to the embodiment accommodated with the first and second coil patterns 231 and 232, the printed circuit board 500A may have an inductor function capable of maintaining high magnetic permeability even at a high frequency at a low cost. Further, as the coil structure 200A according to an embodiment may have a thin-film type structure as it will be described below, it can be slimmed and miniaturized. In particular, the printed circuit board 500A may have an electrical connection path through the wiring vias 113a1 and 113b1 without external electrodes, which leads to a further reduced thickness. Accordingly, a printed circuit board 500A according to an embodiment, in which such coil structure 200A is accommodated, can also be slimmed and miniaturized. Further, as the side surface of each of the first and second wiring vias 113a1 and 113b1 is physically spaced apart from the magnetic substance of the body 210 and thus may be electrically isolated therefrom, an electric short, or the like, can be prevented. Meanwhile, the printed circuit board 500A according to an embodiment can be utilized as a package substrate, which is a case in which an electronic component 320, such as a semiconductive chip, may be surface-mounted on the printed circuit board 500A through the first electrical connection metal 150. As the coil structure 500A may be built in the printed circuit board 500A to be positioned directly below the electronic component 320, an electric path of a quantum can be minimized. Due to reduced resistance, inductor performance can be further improved.

Meanwhile, a printed circuit board 500A according to an embodiment may include a capacitor 310 disposed in parallel with the coil structure 200A in the through-portion 111H and embedded in the first build-up layer 121A. The capacitor 310 may be a chip-type component including a body 311 having an internal electrode and first and second external electrodes 312 and 313 spaced apart from each other in the body 311. For example, the capacitor 310 may be a multilayer ceramic capacitor (MLCC), but is not limited thereto. The first and second external electrodes 312 and 313 may be electrically connected to at least a portion of the first wiring layer 122 through third and fourth wiring vias 113a2 and 113a3 of the first via layer 113, respectively.

In addition to the coil structure 200A, the capacitor 310 may further be accommodated in the printed circuit board 500A according to an embodiment, and this further provides the printed circuit board 500A with capacitor functions in addition to inductor functions at a relatively low price. Further, the capacitor 310 is manufactured in the form of a separate component to be accommodated in the printed circuit 500A, thereby enabling slimming and miniaturization of the printed circuit board 500A. This will also enable slimming and miniaturization of the printed circuit board 500A according to an embodiment, in which the capacitor 310 is built. Further, when a printed circuit board 500A according to an embodiment is used as a package substrate, the capacitor 310, as the coil structure 200A, can be positioned directly below the electronic component 320. This can minimize an electric path therebetween, and due to reduced equivalent series inductance (ESL), capacitor performance can be further improved.

Hereinbelow, components of a printed circuit board 500A according to an embodiment will be described with reference to the accompanying drawings.

The core layer 111 may be a core board, a center of the printed circuit board 500A. The core layer 111 may be formed of an insulating material, and as the insulating material, a thermosetting resin such as an epoxy resin, a thermoplastic resin such as polyimide, or a material, such as a copper clad laminate (CCL), an unclad CCL, or the like, including a glass fiber (or a glass cloth or a glass fabric) and/or a reinforcing material such as an inorganic filler together with the thermosetting or thermoplastic resin may be used, but it is not limited thereto. As the core layer 111, a metal plate, a glass plate, or a ceramic plate may be used. If necessary, a liquid crystal polymer may be used as a material of the core layer 111.

A material of the core wiring layers 112a and 112b may be a metal, and copper (Cu), aluminum (Al), silver (Ag), tin (Sn), gold (Au), nickel (Ni), lead (Pb), titanium (Ti), and alloys thereof may be used as the metal. The core wiring layers 112a and 112b may be formed by a plating process such as an additive process (AP), a semi additive process (SAP), a modified semi additive process (MSAP), tenting (TT), or the like, and as a result, may include a seed layer, which is an electroless plating layer, and an electroplating layer formed based on said seed layer. The core wiring layers 112a and 112b may perform various functions according to a design of a corresponding layer. For example, a ground (GrouND: GND) pattern, a power (PoWeR: PWR) pattern, a signal (Signal: S) pattern, and the like, may be included. The S pattern may include various signals, for example, data signals, and the like, excluding the GND patterns and the PWR patterns. If necessary, the GND pattern and the PWR may be identical. These patterns may include a line pattern, a plane pattern and/or a pad pattern.

A metal may be also used as a material of the core via layer 113, and copper (Cu), aluminum (Al), silver (Ag), tin (Sn), gold (Au), nickel (Ni), lead (Pb), titanium (Ti), and alloys thereof may be used as the metal. The core via layer 113 may be formed by AP, SAP, MSAP, TT, or other plating method, and can thus include a seed layer, which is an electroless plating layer, and an electroplating layer formed based on said seed layer. Each wiring via of the core via layer 113 may be fully charged with a metal or formed by a metal formed along a wall surface. In addition, all known shapes including am hourglass shape, a cylindrical shape, and the like, may be applied thereto. The core via layer 113, too, may perform various functions according to a design of a corresponding layer. For example, the core via layer 113 may include a wiring via for signal connection, a wiring via for ground connection, a wiring via for power connection, and the like. The wiring vias for ground connection and power connection may be identical.

The build-up layers 121A and 121c to 121f may provide an insulating region for formation of multiple layers of a wiring line on both sides of the core layer 111. A material of the build-up layers 121A and 121c to 121f may be an insulating material, and as for the insulating material, a thermosetting resin such as an epoxy resin, a thermoplastic resin such as polyimide, or a material, such as prepreg, ABF, or the like, including a glass fiber and/or a reinforcing material such as an inorganic filler together with the thermosetting or thermoplastic resin may be used. If necessary, a photo imageable dielectric (PID) may be used as a material of the build-up layers 121A and 121c to 121f. Meanwhile, the build-up layers 121A and 121c to 121f may include the same or different materials. The build-up layers 121A and 121c to 121f may have clear or unclear boundaries. The first build-up layer 121A may include an integrated upper insulating layer 121a and an integrated lower insulating layer 121b, thereby rendering boundaries thereof clear or unclear.

A metal may be used as a material of the wiring layers 122a to 122f, and copper (Cu), aluminum (Al), silver (Ag), tin (Sn), gold (Au), nickel (Ni), lead (Pb), titanium (Ti), and alloys thereof may be used as the metal. The wiring layers 122a to 122f may be formed by AP, SAP, MSAP, TT, or other plating method, and can thus include a seed layer, which is an electroless plating layer, and an electroplating layer formed based on said seed layer. The wiring layers 122a to 122f may perform various functions according to a design of a corresponding layer. For example, a GND pattern, a PWR pattern, an S pattern, and the like, may be included. The S pattern may include various signals, for example, data signals, and the like, excluding the GND patterns and the PWR patterns. If necessary, the GND pattern and the PWR may be identical. These patterns may include a line pattern, a plane pattern and/or a pad pattern.

A metal may be also used as a material of the via layers 123a to 123f, and copper (Cu), aluminum (Al), silver (Ag), tin (Sn), gold (Au), nickel (Ni), lead (Pb), titanium (Ti), and alloys thereof may be used as the metal. The via layers 123a to 123f may be formed by AP, SAP, MSAP, TT, or another plating method, and can thus include a seed layer, which is an electroless plating layer, and an electroplating layer formed based on said seed layer. Each wiring via of the via layers 123a to 123f may be fully charged with a metal or formed by a metal formed along a wall surface. In addition, all known shapes including an hourglass shape, a cylindrical shape, and the like, may be applied thereto. For example, the wiring vias of the first, third and fifth via layers 123a, 123c and 123e and those of the second, fourth and sixth via layers 123b, 123d and 123f may have shapes tapered in opposite directions. The via layers 123a to 123f may perform various functions according to a design of a corresponding layer. For example, the via layers 123a to 123f may include a wiring via for signal connection, a wiring via for ground connection, a wiring via for power connection, and the like. The wiring vias for ground connection and power connection may be identical.

The passivation layers 130 and 140 may protect an internal constitution of the printed circuit board according to an embodiment from physical or chemical damage, and the like, from outside. The passivation layers 130 and 140 may include a thermosetting resin. For example, the passivation layers 130 and 140 may be an ABF, but are not limited thereto. The passivation layers 130 and 140 may be known solder resist (SR) layers. Further, a PID may be included if necessary. Each of the passivation layers 130 and 140 may include a plurality of openings 130h and 140h, and each of the openings 130h and 140h can expose at least portions of the fifth and sixth wiring layers 122e and 122f, which are uppermost and lowermost wiring layers, of the printed circuit board 500A according to an embodiment, respectively. Meanwhile, the exposed fifth and sixth wiring layers 122e and 122f may have a surface treatment layer formed on a surface thereof. The surface treatment layer may be formed by, for example, electrolytic gold plating, electroless gold plating, organic solderability preservative (OSP) or electroless tin plating, electroless silver plating, electroless nickel plating/replacement gold plating, direct immersion gold (DIG) plating, hot air solder leveling (HASL), or the like. If necessary, each of the openings 130h and 140h may consist of a plurality of via holes. If necessary, an under-bump metal (UBM) may be arranged in each opening 130$h$ and 140$h$ for reliability improvement.

The electrical connection metals 150 and 160 are a constitution for physical and/or electrical connection of the printed circuit board 500A to an outside. For example, an electronic component 320 may be mounted on the printed circuit board 500A according to an embodiment via the first electrical connection metal 150. Alternately, the printed circuit board 500A according to an embodiment may be mounted on a mainboard of the electronic device via the second electrical connection metal 160. For example, the printed circuit board 500A according to an embodiment may be a ball grid array (BGA)-type package board. The electrical connection metals 150 and 160 may be disposed on a plurality of the openings 130$h$ and 140$h$ of the passivation layers 130 and 140, respectively. The electrical connection metals 150 and 160 may include a metal, for example, Sn or an alloy including Sn, having a low melting point, that is, a metal having a melting point lower than Cu. For example, the electrical connection metals 150 and 160 may be formed with a solder, but is merely an example. A material thereof is not particularly limited thereto.

The electrical connection metals 150 and 160 may be a land, a ball, a pin, or the like. The electrical connection metals 150 and 160 may be formed in multilayer structures or a single layer structure. In the case of the multilayer structures, a copper pillar and a solder may be included, whereas in the case of the single layer, a tin-silver solder may be included; however, this is merely an example, and is not limited thereto. The electrical connection metals 150 and 160 are not particularly limited in terms of a number, interval, disposition, or the like, and can be sufficiently modified by one of ordinary skill in the art according to design particulars. The second electrical connection metal 160 is for mounting on the mainboard, and may be present in a larger number and have a larger size compared to the first electrical connection metal 150. In this aspect, a larger number of the second openings 140$h$ may be present compared to the first openings 130$h$ and may be bigger.

Figure 4:
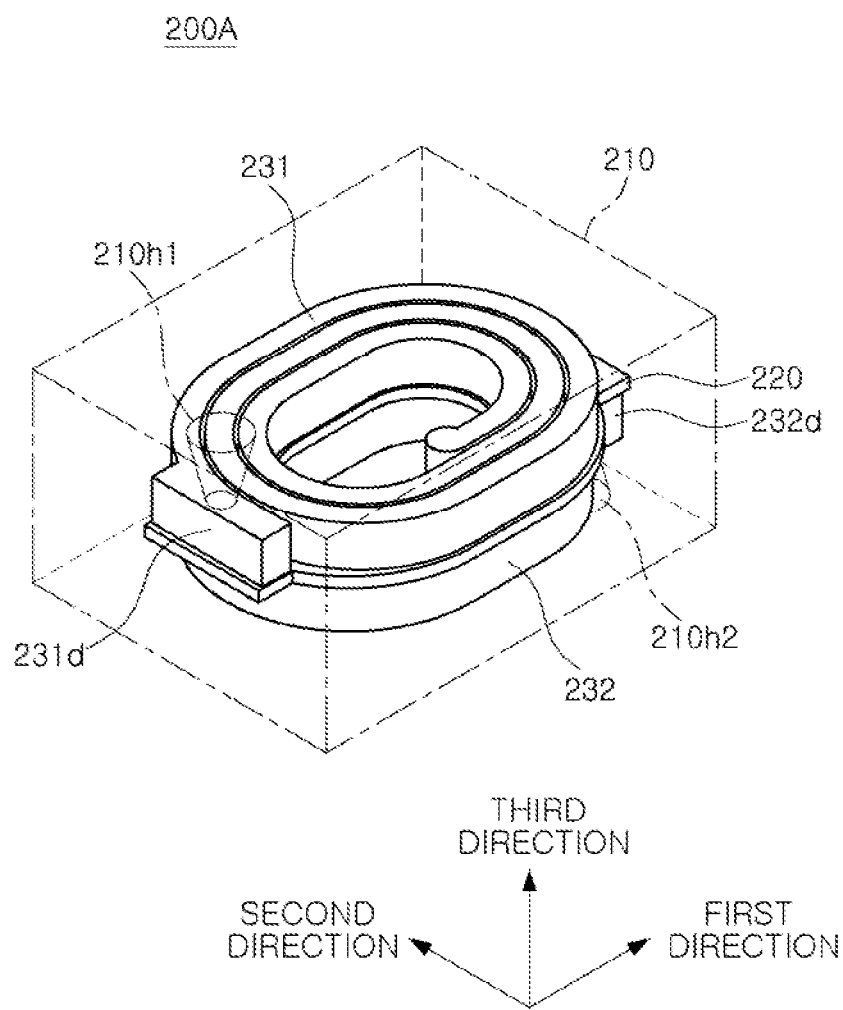
FIG. 4 is a perspective view schematically illustrating a coil structure applied to the printed circuit board of FIG. 3.
Figure 5:
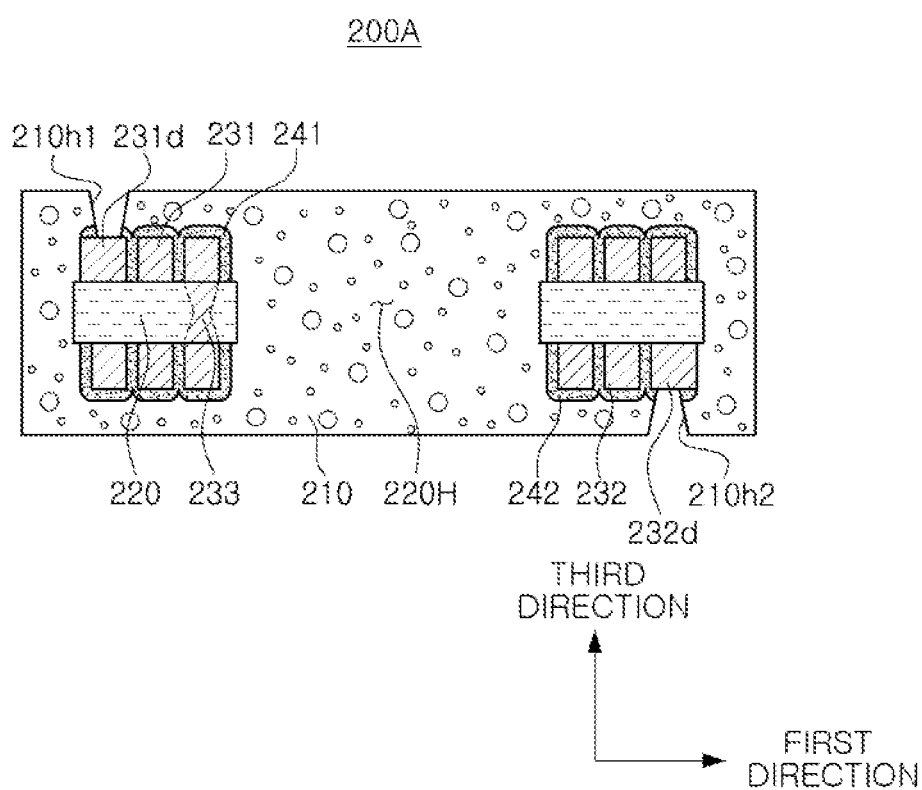
FIG. 5 is a cross-sectional view schematically illustrating a coil structure applied to the printed circuit board of FIG. 3.
Figure 6:
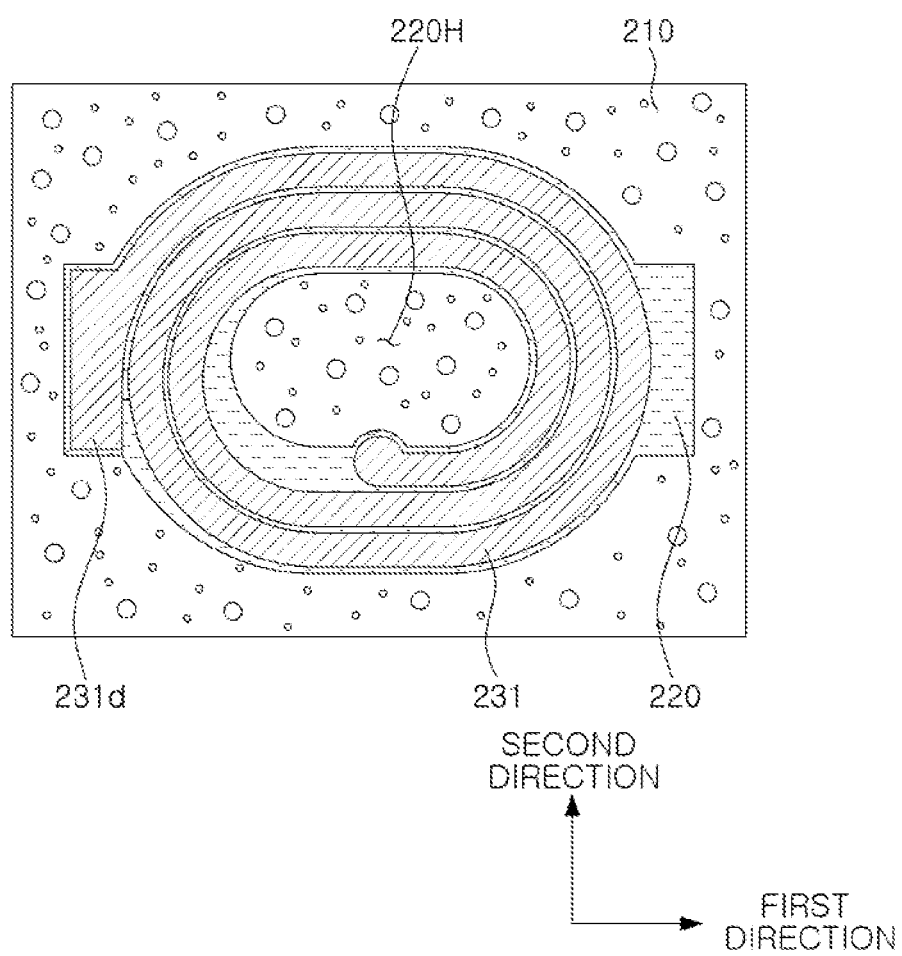
FIGS. 6 and 7 are planar views schematically illustrating a coil structure applied to the printed circuit board of FIG. 3.
Figure 7:
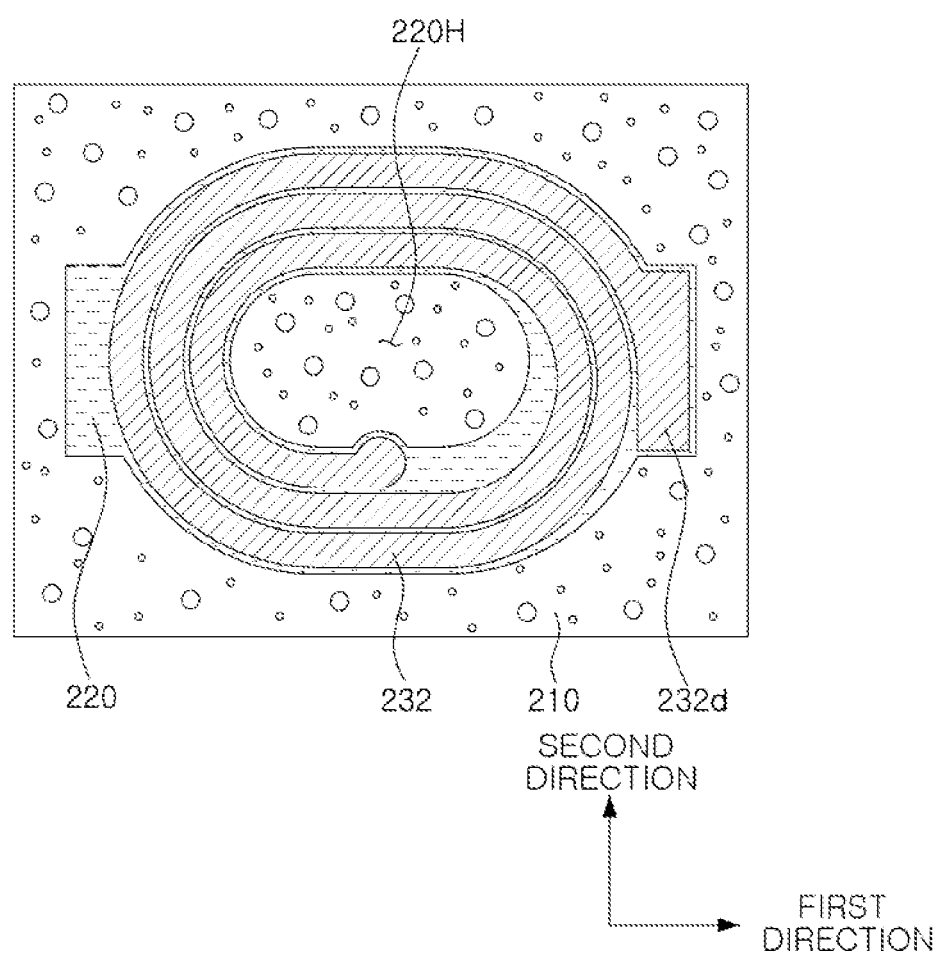

FIG. 4 is a perspective view schematically illustrating a coil structure applied to the printed circuit board of FIG. 3, and FIG. 5 is a cross-sectional view schematically illustrating a coil structure applied to the printed circuit board of FIG. 3, while FIGS. 6 and 7 are planar views schematically illustrating a coil structure applied to the printed circuit board of FIG. 3.

Based on FIGS. 4 to 7, a coil structure 200A according to an embodiment includes a support member 220, a first coil pattern 231 in a planar spiral form disposed on an upper surface of the support member 220, and a body 210 including a magnetic substance. The support member 220 and the first coil pattern 231 are accommodated in the body 210. If necessary, the coil structure 200A may further include a second coil pattern 232 in a planar spiral form disposed on a lower surface of the support member and accommodated in the body 210, and a connection via 233 passing through the support member 220 and electrically connecting the first and second coil patterns 231 and 232. If necessary, the coil structure 200A may further include a first insulating film 241 disposed on the upper surface of the support member 220 and covering at least a portion of the first coil pattern 231 and a second insulating film 242 disposed on the lower surface of the support member 220 and covering at least a portion of the second coil pattern 232. For example, a coil structure 200A according to an embodiment may have a thin-film type inductor structure having no external electrodes, as previously described.

Meanwhile, a coil structure 200A according to an embodiment includes first and second openings 210$h$1 and 210$h$2 exposing at least a portion of the first coil pattern and at least a portion of the second coil pattern, respectively. When such coil structure 200A is accommodated in the printed circuit board 500A, the first build-up layer 121A of the printed circuit board 500A fills at least a portion of each of the first and second openings 210$h$1 and 210$h$2. Further, the first and second wiring vias 113$a$1 and 113$b$1 of the printed circuit board 500A pass through at least a portion of the first build-up layer 121A on the first and second openings 210$h$1 and 210$h$2, respectively, to be electrically connected to the first and second coil patterns respectively. Accordingly, as previously described, the printed circuit board 500A may have an inductor function capable of maintaining high magnetic permeability even at a high frequency at a relatively low cost and can be slimmed and miniaturized more effectively. In addition, an electrical path between the previously described electronic component 320 surface-mounted on the printed circuit board 500A can be minimized.

Alternatively, when the coil structure 200A according to an embodiment is built in the printed circuit board 500A, at least a portion of a side surface of each of the first and second wiring vias 113$a$1 and 113$b$1 of the printed circuit board 500A may be covered by the first build-up layer 121A of the printed circuit board 500A in the first and second openings 210$h$1 and 210$h$2. For example, a side surface of each of the first and second wiring vias 113$a$1 and 113$b$1 may be surrounded by an insulating substance of the first build-up layer 121A to be electrically isolated. Accordingly, the side surface of each of the first and second wiring vias 113$a$1 and 113$b$1 is physically spaced apart from the magnetic substance of the body 210 and thus may be electrically isolated therefrom. Consequently, an electric shock, or the like, can be prevented.

Meanwhile, a coil structure 200A according to an embodiment may include a support member 220 and first and second coil patterns 231 and 232 not exposed to a side surface of the body 210. For example, an exterior side surface of the support member 220 and exterior side surfaces of the first and second coil patterns 231 and 232 may be physically spaced apart from the first build-up layer 121A of the printed circuit board 500A. At least a portion between the first build-up layer 121A and the exterior side surface of the support member 220, and at least a portion between the first build-up layer 121A and the exterior side surfaces of the first and second coil patterns 231 and 233 may be filled with the magnetic substance. In this case, the side surfaces of the first and second coil patterns 231 and 232 may be more effectively surrounded by the magnetic substance of the body 210, which may increase amount of the magnetic substance. This will improve inductor characteristics.

Hereinbelow, constitutional components of the coil structure 200A according to an embodiment will be described in more detail with reference to the accompanying drawings.

The body 210 forms exterior appearance of the coil structure 200A. The body 210 may include first and second surfaces facing in a first direction, third and fourth surfaces facing in a second direction, and fifth and sixth surfaces facing in a third direction. In this regard, the body 210 may be hexahedral, but is not limited thereto. The body 210 includes a magnetic substance. The magnetic substance is not particularly limited as long as it has magnetic properties. For example, the magnetic substance may be pure iron powder, an Fe alloy such as Fe—Si alloy powder, Fe—Si—Al alloy powder, Fe—Ni alloy powder, Fe—Ni—Mo alloy powder, Fe—Ni—Mo—Cu alloy powder, Fe—Co alloy powder, Fe—Ni—Co alloy powder, Fe—Cr alloy powder, Fe—Cr—Si alloy powder, Fe—Ni—Cr alloy powder, Fe—Cr—Al alloy powder, or the like, an amorphous alloy such as an Fe-based amorphous alloy, a Co-based amorphous alloy, or the like, a spinel-type ferrite such as an Mg—Zn ferrite, a Mn—Zn ferrite, an Mn—Mg ferrite, a Cu—Zn ferrite, an Mg—Mn—Sr ferrite, an Ni—Zn ferrite, or the like, a hexagonal ferrite such as a Ba—Zn ferrite, a Ba—Mg ferrite, a Ba—Ni ferrite, a Ba—Co ferrite, a Ba—Ni—Co ferrite, or the like, or a garnet-type ferrite such as a Y-based ferrite.

Meanwhile, the magnetic substance of the body 210 may be a magnetic resin composite containing metal magnetic powder and a resin mixture. The metal magnetic powder may include iron (Fe), chromium (Cr), or silicon (Si) as a main ingredient. For example, metal magnetic powder may include Fe—Ni, Fe, Fe—Cr—Si, and the like, but is not limited thereto. The resin mixture may include an epoxy, a polyimide, a liquid crystal crystalline polymer, or the like, but is not limited thereto. The metal magnetic powder may be a mixture of magnetic metal powder particles having at least two or at least three average particle diameters. For example, bimodal metal magnetic powder particles having different average particle diameters or trimodal metal magnetic powder particles having different average particle diameters may be used. In this case, a filling rate of the metal magnetic powder particles can be increased. Accordingly, the inductor characteristics of the coil structure 200A including the same may be further improved.

The supporting member 220 is to form the coil patterns 231 and 232 thinner and to more easily form the same, and may be an insulating base formed of an insulating resin. The insulating resin may be a thermosetting resin such as epoxy resin, a thermoplastic resin such as polyimide, or a material, such as a copper clad laminate (CCL), an unclad CCL, prepreg, ABF, or the like, including a glass fiber and/or a reinforcing material such as an inorganic filler together with the thermosetting or thermoplastic resin. When the support member 220 includes a glass fiber, rigidity thereof may be excellent. The support member 220 may have a through-hole 220H penetrating the support member 220 in a region corresponding to a center portion of each of the coil patterns 231 and 232. At least a portion of the through-hole 220H may be filled with the magnetic substance of the body 210. In this case, the through-hole 220H may be filled with a magnetic substance such that a magnetic core may be formed at the center of the coil patterns 231 and 232. Accordingly, inductance characteristics can be further improved.

The coil patterns 231 and 232 have a planar spiral shape. For example, the coil patterns 231 and 232 may have at least two turns on the plane. Accordingly, a thin inductor having high inductance can be achieved. The coil patterns 231 and 232 may include a metal, and the metal may be copper (Cu), aluminum (Al), silver (Ag), tin (Sn), gold (Au), nickel (Ni), lead (Pb), titanium (Ti), alloys thereof, or the like. The coil patterns 231 and 232 may be formed by isotropic plating. For example, the coil patterns 231 and 232 may be formed by a plating process such as AP, SAP, MSAP, and TT. This may result in including a seed layer, which is an electroless plating layer, and an electrolytic plating layer formed based thereon. The coil patterns 231 and 232, however, are not limited thereto. The coil patterns 231 and 232 may be formed by anisotropic plating. In this case, each of the coil patterns 231 and 232 may include a greater number of plating layers, and may structurally have a high aspect ratio (AR), which is a ratio of height to line width. Each of the coil patterns 231 and 232 may have lead terminals 231d and 232d. The lead terminals 231d and 232d may be exposed by the openings 210h1 and 210h2 of the body 210, respectively. The wiring vias 113a1 and 113b1 of the printed circuit board 500A may be connected to the exposed portion of each of the lead terminals 231d and 232d.

The connection via 233 electrically connects the coil patterns 231 and 232 to each other, thereby forming a single coil. The connection via 233 may also include a metal, and the metal may be Cu, Al, Ag, Sn, Au, Ni, Pb, Ti, alloys thereof, or the like. The connection via 233 may be formed by a plating process such as AP, SAP, MSAP, TT, or the like. This may result in including a seed layer, which is an electroless plating layer, and an electrolytic plating layer formed based thereon. A cross-sectional shape of the connection via 233 is also not particularly limited, and may be, for example, a tapered shape, an inverse tapered shape, an hourglass shape, a cylindrical shape, or the like.

The insulating films 241 and 242 are to protect and insulate the coil patterns 231 and 232 and may contain an insulating material. For example, a conventional insulating material used in an insulation coating, such as an epoxy resin, a thermoplastic resin such as a polyimide resin, or the like, may be contained, but it is not limited thereto. The insulating films 241 and 242 may be formed by a coating process, and compared to the coil patterns 231 and 232, may be much thinner. The insulating films 241 and 242 may be formed along an outer surface of the coil patterns 231 and 232 to a certain thickness. The openings 210h1 and 210h2 of the body may extend and pass through a portion of each of the insulating films 241 and 242, respectively.

Figure 8:
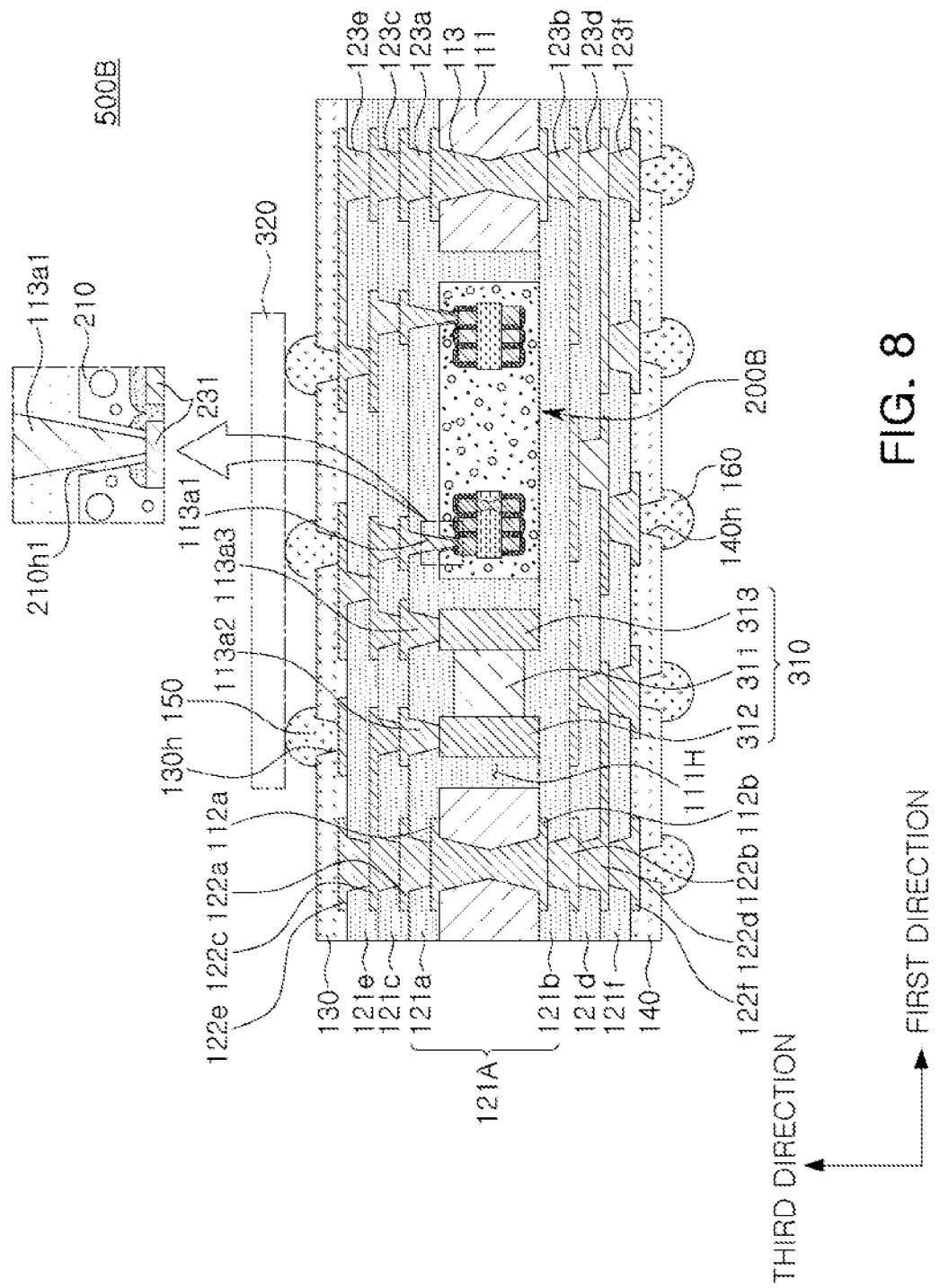
FIG. 8 is a cross-sectional view schematically illustrating another example of a printed circuit board.

FIG. 8 is a cross-sectional view schematically illustrating another example of a printed circuit board.

Based on FIG. 8, a printed circuit board 500B according to another embodiment may have a first opening 210h1 formed only on an upper side of a coil structure 200B. For example, a body 210 of the coil structure 200B may have a plurality of first openings 210h1 partially exposing a first coil pattern 231 in different positions. A first build-up layer 121A may fill at least a portion of the plurality of first openings 210h1. A first via layer 123a may include a plurality of first wiring vias 113a1, and the plurality of first wiring vias 113a1 may pass through at least a portion of the first build-up layer 121A on the plurality of first openings 210h1 to be connected to the first coil patterns 231 at different positions. At least a portion of a side surface of each of the plurality of first wiring vias 131a in the plurality of first openings 210h1 may be covered by the first build-up layer 121A. In accordance with such a structure, a turn shape of the coil patterns 231 and 232 of the coil structure 200B, a position of lead terminals, a connection position through a connection via, and the like may be appropriately changed. Other descriptions are substantially the same as the above, and thus, detailed descriptions thereof will be omitted.

Figure 9:
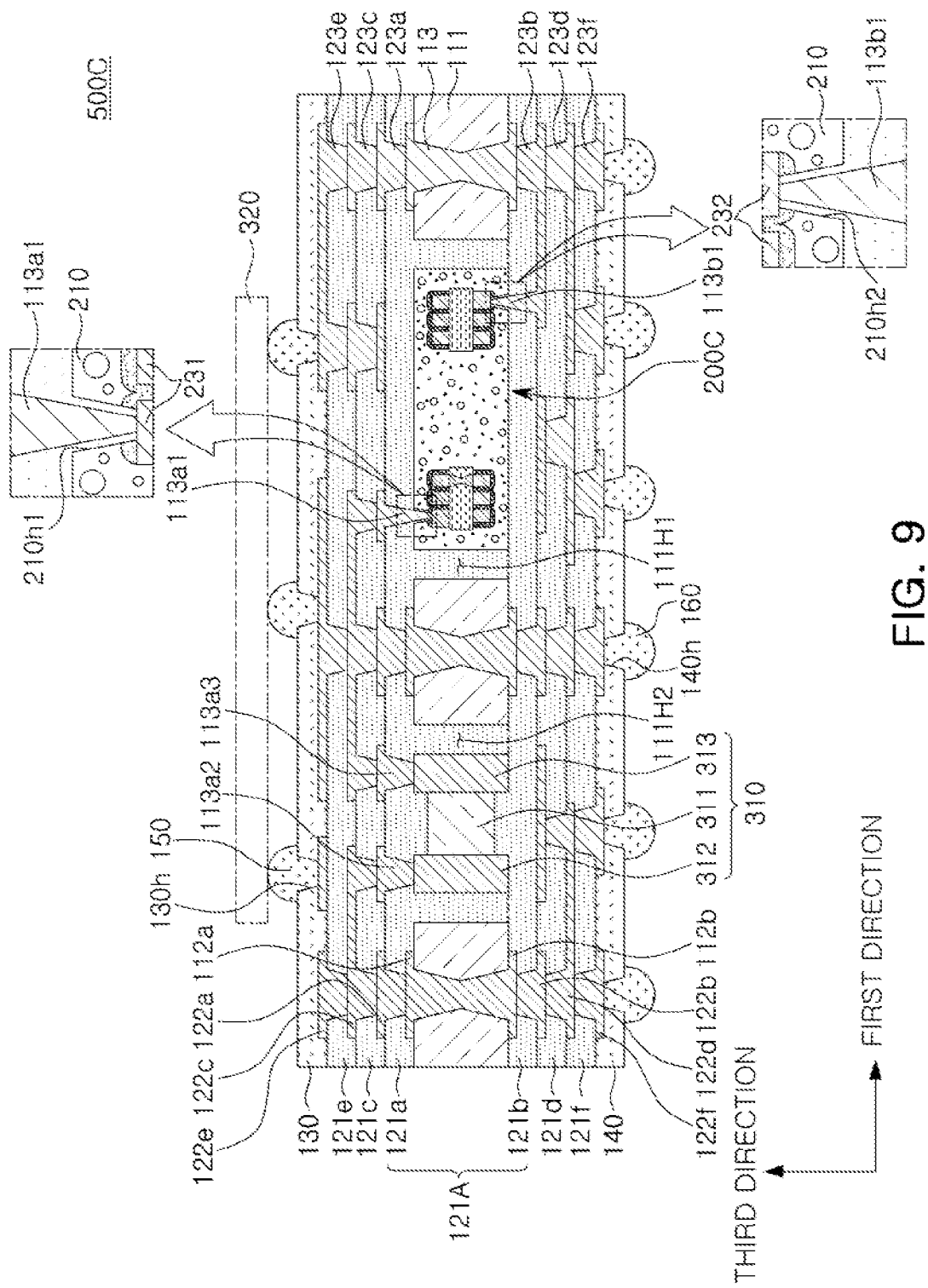
FIG. 9 is a cross-sectional view schematically illustrating another example of a printed circuit board.

FIG. 9 is a cross-sectional view schematically illustrating another example of a printed circuit board.

Based on FIG. 9, a printed circuit board 500C according to another embodiment may have a core layer 111 on which first and second through-portions 111H1 and 111H2 are spaced apart from each other, and in the first and second through-portions 111H1 and 111H2, the coil structure 200C and the capacitor 310 are disposed in parallel. A first build-up layer 121A fills at least a portion of each of the first and second through-portions 111H1 and 111H2 to accommodate the coil structure 200C and the capacitor 310. Other descriptions are substantially the same as the above, and thus, detailed descriptions thereof will be omitted.

Figure 10:
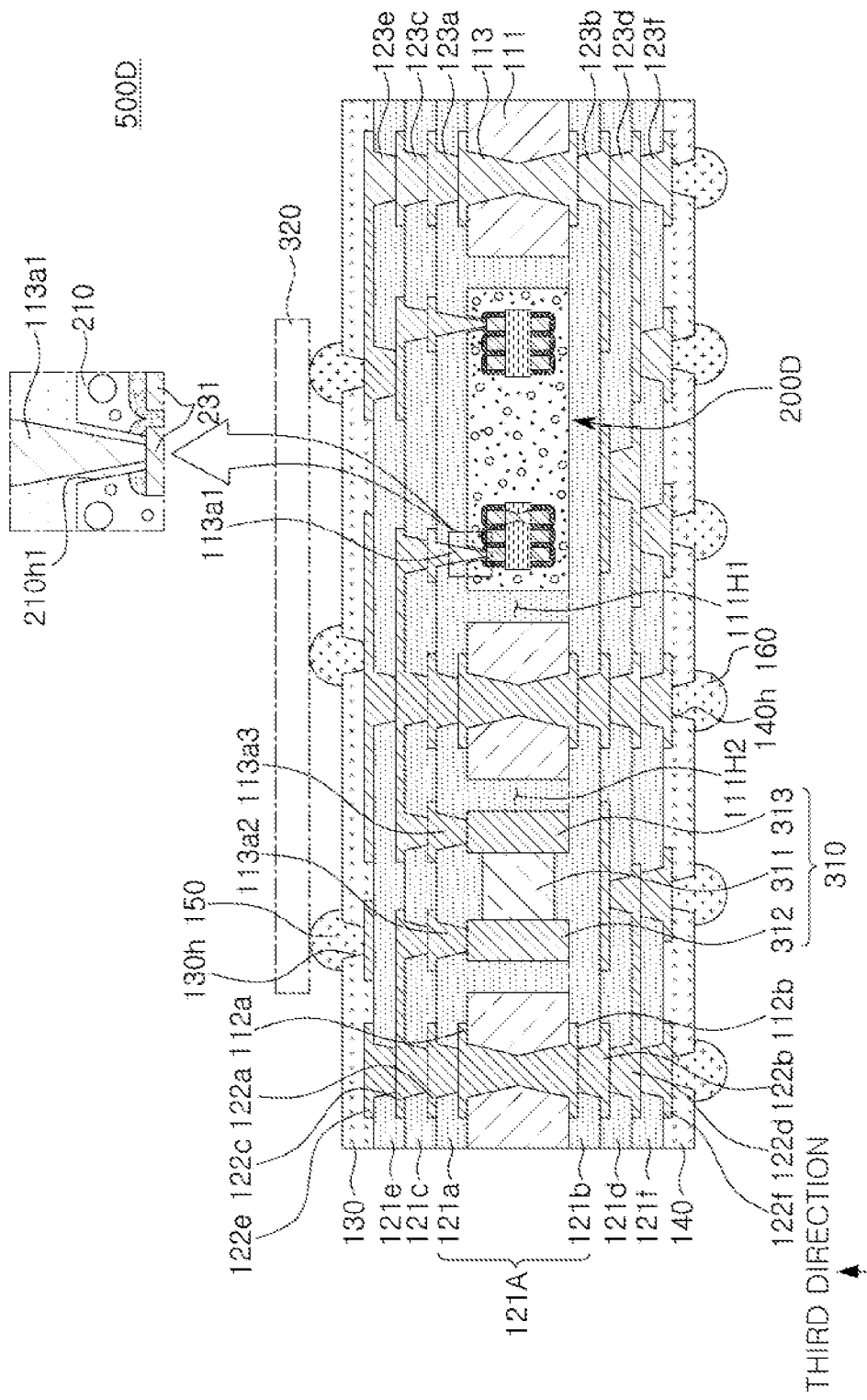
FIG. 10 is a cross-sectional view schematically illustrating another example of a printed circuit board.

FIG. 10 is a cross-sectional view schematically illustrating another example of a printed circuit board.

Based of FIG. 10, a printed circuit board 500D according to another embodiment may have a first opening 200h1 formed only on an upper side of a coil structure 200B. For example, a body 210 of the coil structure 200D may have a plurality of first openings 210h1 partially exposing a first coil pattern 231 at different positions. A first build-up layer 121A may fill at least a portion of the plurality of first openings 210h1. A first via layer 123a may include a plurality of first wiring vias 113a1, and the plurality of first wiring vias 113a1 may pass through at least a portion of the first build-up layer 121A on the plurality of first openings 210h1 to be connected to the first coil patterns 231 at different positions. At least a portion of a side surface of each of the plurality of first wiring vias 1131a in the plurality of first openings 210h1 may be covered by the first build-up layer 121A. In accordance with such a structure, a turn shape of the coil patterns 231 and 232 of the coil structure 200D, a position of lead terminals, a connection position through a connection via, and the like may be appropriately changed. Additionally, a core layer 111 has first and second through-portions 111H1 and 111H2 spaced apart from each other. In the first and second through-portions 111H1 and 111H2, the coil structure 200D and the capacitor 310 are disposed in parallel. The first build-up layer 121A fills at least a portion of each of the first and second through-portions 111H1 and 111H2 to accommodate the coil structure 200D and the capacitor 310. Other descriptions are substantially the same as the above, and thus, detailed descriptions thereof will be omitted.

As one of the effects of the present disclosure, a printed circuit board having high magnetic permeability even at a high frequency and a function of an inductor may be provided.

As another effect, a printed circuit board, which can be slimmed and miniaturized by reduction of a thickness can be provided.

As another effect, a printed circuit board having a function of a capacitor, in addition to that of an inductor, may be provided.

As used herein, the terms "side portion," "side surface," and the like, are used to refer to a first or second direction or a surface in said direction. The terms "upper side," "upper portion", "upper surface," the like, are used to refer to a third direction or a surface in said direction, while the terms "lower side," "lower portion," "lower surface," and the like, are used to refer to a direction opposite to the third direction or a surface in said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of rights of the exemplary embodiments is not particularly limited to the above terms.

As used herein, the term "connected" may not only refer to "directly connected" but also include "indirectly connected" by means of an adhesive layer, or the like. The term "electrically connected" may include both the case in which constitutional elements are "physically connected" and the case in which constitutional elements are "not physically connected." Further, the terms "first," "second," and the like may be used to distinguish one constitutional element from another, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and does not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

Terms used herein are used only in order to describe an exemplary embodiment rather than limiting the present disclosure. In this case, singular forms include plural forms unless interpreted otherwise in context.

What is claimed is:

1. A printed circuit board, comprising:
a core layer having a first through-portion;
a coil structure disposed in the first through-portion and comprising a support member, a first coil pattern in a planar spiral form disposed on one surface of the support member,
and a body comprising a magnetic substance,
wherein the support member and the first coil pattern are accommodated in the body;
a first build-up layer covering at least a portion of the core layer and disposed in at least a portion of the first through-portion,
the coil structure accommodated in the first build-up layer;
a first wiring layer disposed on one surface of the first build-up layer; and
a first via layer passing through at least a portion of the first build-up layer and connected to the first wiring layer,
wherein the first via layer comprises a first wiring via connecting at least a portion of the first wiring layer to the first coil pattern,
the body comprises a first opening exposing a portion of the first coil pattern,
the first build-up layer is disposed in at least a portion of the first opening,
the coil structure further comprises a second coil pattern in a planar spiral form disposed on the other surface of the support member and accommodated in the body,
and a connection via passing through the support member and connecting the first and second coil patterns to each other,
the support member comprises a through-hole passing through the support member in a region corresponding to a center portion of the first coil pattern and a region corresponding to a center portion of the second coil pattern,
the magnetic substance is disposed in at least a portion of the through-hole,
the support member is an insulating base, and
the support member and the body are comprised of different materials.

2. The printed circuit board of claim 1, wherein the first wiring via on the first opening passes through at least a portion of the first build-up layer to be connected to the first coil pattern.

3. The printed circuit board of claim 2, wherein at least a portion of a side surface of the first wiring via in the first opening is covered by the first build-up layer.

4. The printed circuit board of claim 1, wherein the support member and the first coil pattern are spaced apart from a side surface of the body.

5. The printed circuit board of claim 4, wherein an exterior side surface of the support member and an exterior side surface of the first coil pattern are physically spaced apart from the first build-up layer, and
the magnetic substance is disposed in at least a portion between the first build-up layer and the exterior side surface of the support member,
and at least a portion between the first build-up layer and the exterior side surface of the first coil pattern.

6. The printed circuit board of claim 1, wherein the coil structure further comprises a first insulating film disposed on the one surface of the support member and covering at least a portion of the first coil pattern,
and a second insulating film disposed on the other surface of the support member and covering at least a portion of the second coil pattern.

7. The printed circuit board of claim 1, further comprising a second wiring layer disposed on the other surface of the first build-up layer, and
a second via layer passing through at least a portion of the first build-up layer and connected to the second wiring layer,
wherein the second via layer comprises a second wiring via connecting at least a portion of the second wiring layer to the second coil pattern.

8. The printed circuit board of claim 7, wherein the body comprises a first opening exposing at least a portion of the first coil pattern and a second opening exposing at least a portion of the second coil pattern,
the first build-up layer is disposed in at least a portion of the first opening and at least a portion of the second opening,
the first wiring via passes through at least a portion of the first build-up layer on the first opening to be connected to the first coil pattern,
the second wiring via passes through at least a portion of the first build-up layer on the second opening to be connected to the second coil pattern, and
at least a portion of the first wiring via in the first opening and at least a portion of the second wiring via in the second opening are covered by the first build-up layer.

9. The printed circuit board of claim 1, wherein the first via layer further comprises a third wiring via connecting at least another portion of the first wiring layer to the first coil pattern at a position different from the first wiring via.

10. The printed circuit board of claim 9, wherein the body comprises first and second openings exposing portions of the first coil pattern at different positions,
the first build-up layer is disposed in portions of the first and second openings, and
the first and third wiring vias pass through portions of the first build-up layer on the first and second openings to be connected to the first coil pattern, respectively,
wherein at least portions of side surfaces of the first and third wiring vias in the first and second openings are covered by the first build-up layer.

11. The printed circuit board of claim 1, further comprising a capacitor disposed in parallel to the coil structure in the first through-portion and accommodated in the first build-up layer,
wherein the first via layer further comprises a fourth wiring via connecting at least the other portion of the first wiring layer to the capacitor.

12. The printed circuit board of claim 1, wherein the core layer further comprises a second through-portion spaced apart from the first through-portion,
the printed circuit board further comprises a capacitor disposed in parallel to the coil structure in the second through-portion and accommodated in the first build-up layer,
wherein the first via layer further comprises a fourth wiring via connecting at least the other portion of the first wiring layer to the capacitor.

13. The printed circuit board of claim 1, further comprising first and second core wiring layers disposed on one surface and the other surface of the core layer, respectively;
a core via layer passing through at least a portion of the core layer and connecting the first and second core wiring layers to each other;
a second wiring layer disposed on the other surface of the first build-up layer; and
a second via layer passing through at least a portion of the first build-up layer and connected to the second wiring layer,
wherein the first core wiring layer and the first wiring layer are connected to each other via the first via layer, and
the second core wiring layer and the second wiring layer are connected to each other via the second via layer.

14. The printed circuit board of claim 13, further comprising:
a second build-up layer disposed on one surface of the first build-up layer;
a third wiring layer disposed on the second build-up layer;
a third via layer passing through at least a portion of the second build-up layer and connecting the first and third wiring layers to each other;
a first passivation layer disposed on the second build-up layer and comprising a plurality of first openings exposing at least a portion of the third wiring layer;
a third build-up layer disposed on the other surface of the first build-up layer;
a fourth wiring layer disposed on the third build-up layer;
a fourth via layer passing through at least a portion of the third build-up layer and connecting the second and fourth wiring layers to each other; and
a second passivation layer disposed on the third build-up layer and comprising a plurality of second openings exposing at least a portion of the fourth wiring layer.

15. A printed circuit board, comprising:
a plurality of insulating layers,
a plurality of wiring layers,
and a plurality of via layers; and
a coil structure embedded in the plurality of insulating layers,
wherein the coil structure comprises a support member,
a first coil pattern in a planar spiral form disposed on one surface of the support member,
and a body comprising a magnetic substance,
the support member and the first coil pattern embedded in the body, at least one of the plurality of via layers connects at least one of the plurality of wiring layers to the first coil pattern, at least one of the plurality of insulating layers extends into an opening of the body so as to be interposed between the at least one of the plurality of via layers and the body, the coil structure further comprises a second coil pattern in a planar spiral form disposed on the other surface of the support member and accommodated in the body, and a connection via passing through the support member and connecting the first and second coil patterns to each other, the support member comprises a through-hole passing through the support member in a region corresponding to a center portion of the first coil pattern and a region corresponding to a center portion of the second coil pattern, the magnetic substance is disposed in at least a portion of the through-hole, the support member is an insulating base, and the support member and the body are comprised of different materials.

\* \* \* \* \*